(12) United States Patent
Xie

(10) Patent No.: US 10,361,680 B2
(45) Date of Patent: Jul. 23, 2019

(54) FUZZY ENTROPY BASED NOISY SIGNAL PROCESSING METHOD AND ITERATIVE SINGULAR SPECTRUM ANALYSIS SOFT THRESHOLD DE-NOISING METHOD

(71) Applicant: Hwashen Electronics Co., Ltd., Zhenjiang (CN)

(72) Inventor: Hongbo Xie, Forest Lake (AU)

(73) Assignee: Hwashen Electronics Co., Ltd., Zhejiang (CN)

( * ) Notice: Subject to any disclaimer, the term of this patent is extended or adjusted under 35 U.S.C. 154(b) by 0 days.

(21) Appl. No.: 15/612,567

(22) Filed: Jun. 2, 2017

(65) Prior Publication Data

US 2018/0138896 A1 May 17, 2018

(30) Foreign Application Priority Data

Nov. 17, 2016 (CN) .......................... 2016 1 1010791

(51) Int. Cl.
*H03H 17/02* (2006.01)
*G06F 17/16* (2006.01)
*G06F 17/18* (2006.01)

(52) U.S. Cl.
CPC ......... *H03H 17/0219* (2013.01); *G06F 17/16* (2013.01); *G06F 17/18* (2013.01); *H03H 17/0255* (2013.01); *H03H 2222/02* (2013.01)

(58) Field of Classification Search
CPC . H03H 17/0219; H03H 17/0255; G06F 17/16
USPC ......................................................... 708/308
See application file for complete search history.

(56) References Cited

U.S. PATENT DOCUMENTS

2007/0223711 A1* 9/2007 Bai ........................ G01H 3/125
381/56
2014/0316230 A1* 10/2014 Denison ............. A61B 5/04012
600/383

* cited by examiner

*Primary Examiner* — Tan V Mai
(74) *Attorney, Agent, or Firm* — Wayne & Ken, LLC; Tony Hom

(57) ABSTRACT

A fuzzy entropy based noisy signal processing method and an iterative singular spectrum analysis (SSA) soft threshold de-noising method are disclosed. The method employs FuzzyEn, which is used to quantify the system complexity in chaos theory, to characterize a noise floor, which provides a more effective path for processing of noisy signal; its fuzzy entropy spectrum based iterative singular spectrum analysis soft threshold (SSA-IST) de-noising method outperforms the conventional truncated singular spectrum, wavelet transform and empirical mode decomposition de-noising approaches in de-noising performance.

2 Claims, 5 Drawing Sheets

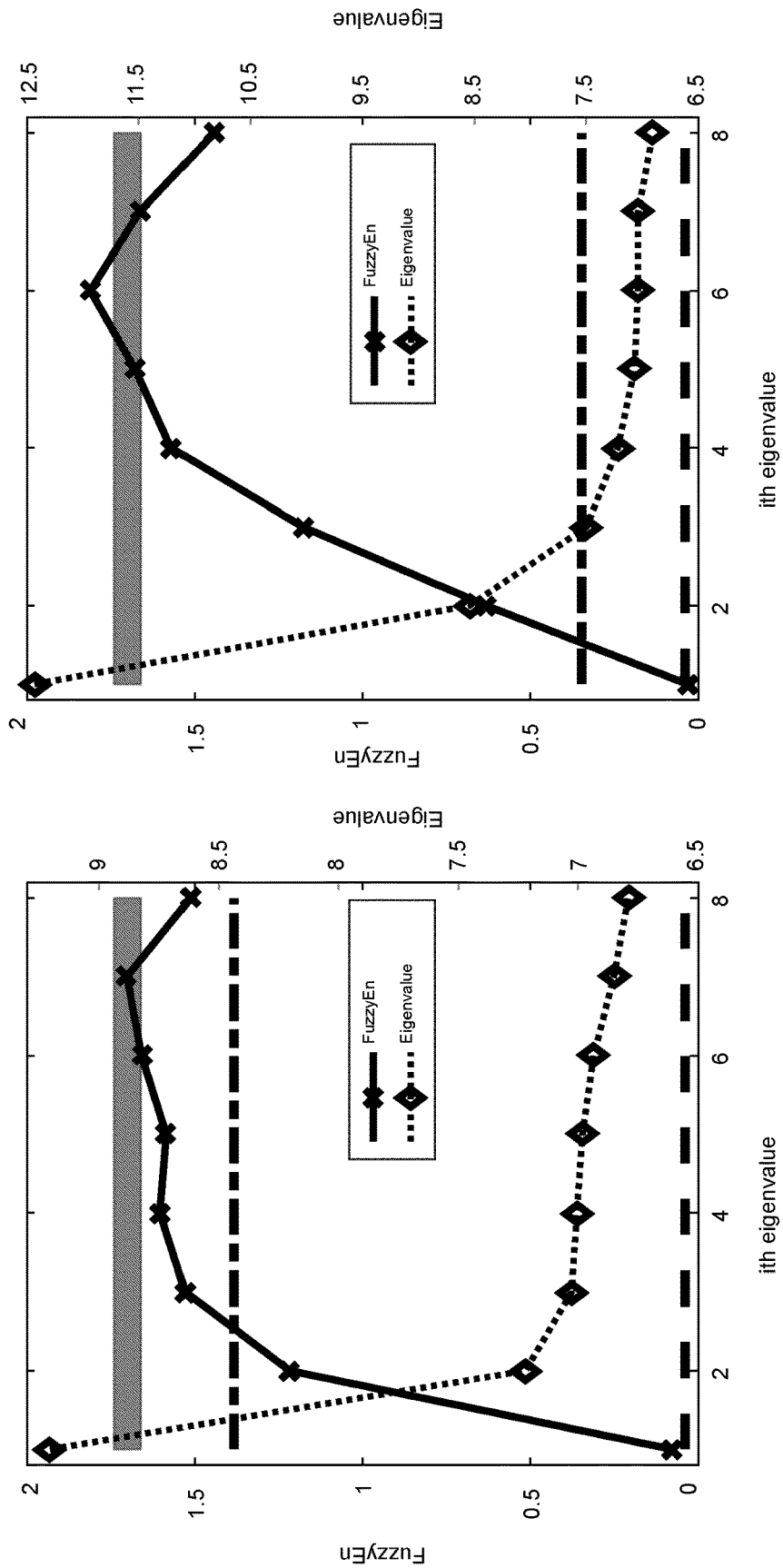

FUZZY ENTROPY BASED NOISY SIGNAL PROCESSING METHOD AND ITERATIVE SINGULAR SPECTRUM ANALYSIS SOFT THRESHOLD DE-NOISING METHOD

CROSS-REFERENCE TO RELATED APPLICATION

This application claims priority to Chinese application number 201611010791.1, filed 17 Nov. 2016. The above-mentioned patent application is incorporated herein by reference in its entirety.

TECHNICAL FIELD

The invention relates to signal de-noising and filtering, and more particularly, to a fuzzy entropy based noisy signal processing method and an iterative singular spectrum analysis soft threshold de-noising method.

BACKGROUND

Singular spectrum analysis (SSA) is an advanced technique for signal processing, incorporating the elements of classical time series analysis, linear algebra, multivariate statistics, and dynamical systems. SSA aims to decompose a signal into the sum of a number of components with physical interpretation, such as a slowly varying trend, oscillatory components, and the noise. Based on these components, different algorithms for de-noising, change-point detection, missing data interpolation, synchronization detection, feature extraction, and prediction have been developed. For filtering out noise, in this method, the eigenvalues of the lagged covariance matrix is first obtained and arranged in a monotonically decreasing order. From a certain order, these eigenvalues may form a relatively planar tailing plane, i.e., so-called "noise floor". The elementary components associated with larger eigenvalues on the initial steep portion of the singular spectrum are retained to form the basis of the signal subspace, while the components associated with the eigenvalues on the noise floor are discarded as the white noise. High eigenvalues corresponds to the fundamental oscillations in the signal, and the largest singular value is typically associated with slow-moving trend. This approach for truncated singular spectrum has been broadly used to de-noise speech, ultrasound, Doppler radar signals, biomedical (Electroencephalogram (EEG), Electrocardiogram (ECG) and Electromyography (EMG)) and mechanical signals, and hyperspectral image. In order to achieve satisfactory de-noising results, previous studies and inventions have focused on determining or finding the optimal order of a noise floor.

The original idea of the approach for truncated SSA is that there should be a 'noise floor' inherent in any signal, however, for many signals with lower signal-to-noise ratio (SNR), the singular spectrum has a smooth power-law form without a clear noise floor. In addition, the SSA algorithm itself only solves the representation problem of determining the best low-rank of the signal-plus-noise measurement matrix, however it says nothing about how to obtain a best estimate of the low-rank signal matrix. Therefore, one cannot expect such SSA de-noising approach to exhibit the optimal performance. In contrast, the singular spectrum employs a binary approach of retaining some components while discarding the other components. This is equivalent to filtering out the high frequency components of the signal, which fails to significantly improve the signal-to-noise ratio.

Fuzzy entropy (FuzzyEn) is a chaotic invariant used to characterize system complexity in chaos theory, and we herein introduce the concept of fuzzy entropy spectrum, with which a noise floor of the signal is represented. Depending on FuzzyEn noise spectrum of noisy signals, the invention proposes an iterative SSA threshold de-noising method.

It is an object of the present invention to, aiming at the shortcomings and disadvantages of the prior art as mentioned above, provide a fuzzy entropy based noisy signal processing method and an iterative singular spectrum analysis soft threshold de-noising method.

SUMMARY

The invention is realized through the following technical scheme:

The invention relates to a fuzzy entropy based noisy signal processing method, wherein for the noisy signal, a noisy signal $X_{in}=\{x_1, x_2, \ldots, x_N\}$ of N samples is considered, and it is assumed that the additive white noise is uncorrelated with the signal, i.e., $X_{in}=\bar{X}+n$, where $\bar{X}$ represents the noise-free signal, and n the white noise, by constructing a series of d-dimensional vectors $X_e^d=\{x_e^d, x_{e+1}^d, \ldots, x_{e+d-1}^d\}$, ($1 \leq e \leq N-d+1$), from the original signals $X_{in}$ and defining the degree of similarity $S_r^d(e)$ and the fuzzy probability $S_r^d$, and constructing a (d+1)-dimensional vector $X_e^{d+1}$ as well as its corresponding degree of similarity $S_r^{d+1}(e)$ and fuzzy probability $S_r^{d+1}$ in the same manner, the FuzzyEn is given by: $FuzzyEn(d,r,N)=-\ln(S_r^{d+1}/S_r^d)$, where d and r are set to 2 and 0.2 respectively, N is the length of the signal to be de-noised, thereby defining the singular spectrum distribution of all components obtained from any signal decomposition approach as a FuzzyEn spectrum.

The invention further relates to an iterative singular spectrum analysis soft threshold de-noising method based on said FuzzyEn spectrum, comprising the following steps:

(1) SSA decomposition: the noisy signal $X_{in}=\{x_1, x_2, \ldots, x_N\}$ is embedded into a m×d Hankel matrix, and SVD is employed to decompose the Hankel matrix into the sum of d rank-1 matrices and then reconstruct d signal components $X_c=\{x_1^c, x_2^c, \ldots, x_N^c\}$ (c=1, ... d);

(2) Calculate FuzzyEn spectrum: the FuzzyEn spectrum of SSA components and the FuzzyEn value of original noisy signal are calculated, according to said FuzzyEn spectrum definition;

(3) Set soft threshold: no threshold de-noising is made to the first component $X_1$, for components from $X_2$ to $X_k$ whose FuzzyEn value is lower than that of the noisy signal, a smaller threshold is set as $\tau_c=\sigma^c\sqrt{2\log_{10}N}/\sqrt{d}$, and for the remaining components from $X_{k+1}$ to $X_d$, a larger threshold is set as $\tau_c=\sigma_c\sqrt{2\log_{10}N}$, where $\sigma_c$ is the variance of component $X_c$;

(4) Soft threshold de-noise: all components $X_c$ (c=2, ..., d) except the first component are de-noised using soft threshold, namely, if the absolute value of the numerical value of a certain noisy signal of each component is lower than the threshold for this component, the output is zero; if the signal value is larger than the threshold, the output is the signal value minus the threshold; otherwise, the output is the signal value plus the threshold, where the sum of all soft threshold de-noised components $\tilde{X}_c$ (c=2, ..., d) and $X_1$ is a first estimated signal $\tilde{X}$ and the estimated noise is set as $\tilde{n}=X_{in}-\tilde{X}$;

(5) Estimate the variance of ñ, using the estimated noise $\tilde{X}$ as an input signal, repeat steps (1) to (4);

(6) Compare the variance of the noise obtained in successive iterations, if the noise variance is no longer decreased significantly or reaches the predetermined iteration times, the iteration stops; otherwise, repeat steps (1) to (5);

(7) The de-noised signal $\tilde{X}$ is the sum of the trend $X_1$ with the minimal noise variance or the predetermined iteration times and all de-noised components $\tilde{X}_c$(c=2, . . . , d).

In summary, beneficial effects according to the technical scheme provided by the present invention are as follows:

Firstly, the invention employs FuzzyEn, which is used to quantify the system complexity in chaos theory, to characterize a noise floor, the FuzzyEn being able to qualitatively represent the noise level of each SSA components relative to white noise and original noisy signal. Based on the FuzzyEn spectrum and filter bank characteristics of SSA, simulations on four synthetic and two experimental signals indicates that the iterative SSA soft threshold de-noising method significantly outperforms the conventional truncated SSA approach, and that it is also slightly superior to Wavelet transform and Empirical mode decomposition de-noising techniques.

On the other hand, regardless of signal properties and noise levels, whether a conventional noise floor exists or not, the proposed FuzzyEn spectrum can accurately provide relative noise level of each component of the noisy signal, which will be an important basis for various signal de-noising or improvement of other signal de-noising approaches. The present invention may be widely applied to de-noising in mobile devices, hearing aids, wearable devices, medical instruments or biomedical, mechanical and radar signals.

BRIEF DESCRIPTION OF THE DRAWINGS

Various additional features and advantages of the invention will become more apparent to those of ordinary skill in the art upon review of the following detailed description of one or more illustrative embodiments taken in conjunction with the accompanying drawings. The accompanying drawings, which are incorporated in and constitute a part of this specification, illustrate one or more embodiments of the invention and, together with the general description given above and the detailed description given below, explain the one or more embodiments of the invention:

FIG. 1A illustrates FuzzyEn spectrum (solid lines) and singular spectrum (dotted lines) of piecewise-regular signal with SNR 0 dB, wherein the dashed lines and the dot-and-dash lines respectively indicate the FuzzyEn for clean and noisy piecewise-regular signal, and the rectangles indicate the 95% confidence band of FuzzyEn for Gaussian white noise;

FIG. 1B illustrates FuzzyEn spectrum (solid lines) and singular spectrum (dotted lines) of piecewise-regular signal with SNR 15 dB, wherein the dashed lines and the dot-and-dash lines respectively indicate the FuzzyEn for clean and noisy piecewise-regular signal, and the rectangles indicate the 95% confidence band of FuzzyEn for Gaussian white noise;

DETAILED DESCRIPTION

Figures 2A, 2B:
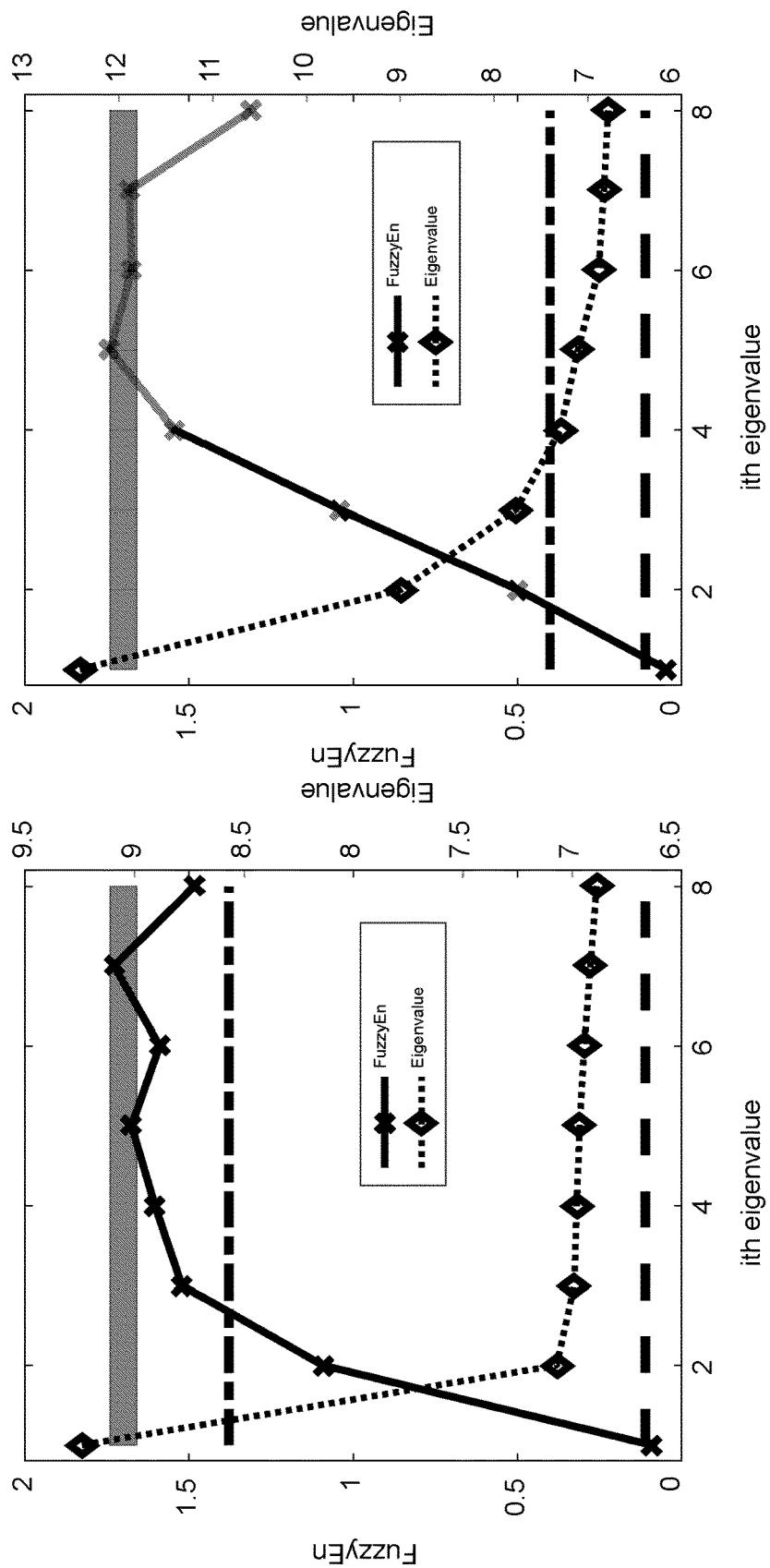
FIG. 2A illustrates FuzzyEn spectrum (solid lines) and singular spectrum (dotted lines) of Riemann signal with SNR 0 dB, wherein the dashed lines and the dot-and-dash lines respectively indicate the FuzzyEn for clean and noisy Riemann signal, and the rectangles indicate the 95% confidence band of FuzzyEn for Gaussian white noise.
FIG. 2B illustrates FuzzyEn spectrum (solid lines) and singular spectrum (dotted lines) of Riemann signal with SNR 15 dB, wherein the dashed lines and the dot-and-dash lines respectively indicate the FuzzyEn for clean and noisy Riemann signal, and the rectangles indicate the 95% confidence band of FuzzyEn for Gaussian white noise.

All the features disclosed in this specification or all the steps in the disclosed methods or processes may be combined in any manner except where such features and/or steps are mutually exclusive.

Any feature disclosed in the specification, including any of the appended claims, the abstract and the drawings, may be replaced with any other equivalents or alternative features for similar purposes, unless otherwise specified. That is, unless specifically stated, each feature is merely an example of a sequence of equivalent or similar features.

FuzzyEn is a chaotic invariant used to characterize system complexity in chaos theory, and herein we first introduce the concept of fuzzy entropy spectrum to obtain a genuine noise floor. Regardless a planar singular spectrum exists or not, the FuzzyEn spectrum can indicate relative noise level of each component of the signal, and identify whether this component is dominated by signal or noise.

When SSA decomposes a signal into its constituent components, based on the FuzzyEn spectrum characteristics of SSA, we present an iterative singular spectrum analysis soft threshold (SSA-ST) method. In order to filtering out the noise at each component, based on its FuzzyEn, we divide it into two sets that are signal- or noise-dominated. To this end, two different threshold formulas are provided to smooth signal- or noise-dominated components, respectively. The experimental results of de-noising four synthetic and two experimental signals (speech and electromyographic signals) demonstrate the effectiveness of the method and significant performance improvements relative to the truncated SSA approach.

I. SSA and Signal Noise Model

We consider a noisy signal $X_{in}=\{x_1, x_2, \ldots, x_N\}$ of N samples, and assume that the additive white noise is uncorrelated with the signal, i.e., $$X_{in}=\overline{X}+n, \quad (1)$$

where $\overline{X}$ represents the noise-free signal, and n the white noise.

With an appropriate window width d, $X_{in}$ may be transformed into a trajectory matrix by a first step "embedding" in SSA:

$$H = \begin{bmatrix} x_1 & x_2 & L & x_d \\ x_2 & x_3 & L & x_{d+1} \\ M & M & L & M \\ x_m & x_{m+1} & L & x_N \end{bmatrix}, \quad (2)$$

where m=N−d+1 is the number of multi-dimensional delayed vector, and H is a Hankel matrix, which means that all of its elements along the main diagonal i+j=const are equal. H can be denoted as:

$$H=\overline{H}+N, \quad (3)$$

where $\overline{H}$ and $N$ represent, respectively, the Hankel matrices constructed from $\overline{X}$ and n in Equation (1).

If m d, the trajectory matrix $H \in \mathbb{R}^{m \times d}$ can be decomposed by singular value decomposition (SVD) as:

$$H=U\Sigma V^T, \quad U \equiv (u_1, u_2, L, u_m), \quad V \equiv (v_1, v_2, L, v_d) \quad (4)$$

where $U \in \mathbb{R}^{m \times m}$ and $V \in \mathbb{R}^{d \times d}$ consist of, respectively, the left and right eigenvectors u and v with orthonormal columns, and $\Sigma=\text{diag}(\lambda_1 \geq \lambda_2 \geq \ldots \geq \lambda_d \geq 0)$. The diagonal elements of $\Sigma$ are called singular values of H, and their set is the singular spectrum. Based on Equation (3), the SVD of H also can be denoted as:

$$H = [U_1 \; U_2] \begin{bmatrix} \Sigma_1 & 0 \\ 0 & \Sigma_2 \end{bmatrix} \begin{bmatrix} V_1^T \\ V_2^T \end{bmatrix}, \quad (5)$$

where $U_f \in \mathbb{R}^{m \times k}$, $\Sigma_f \in \mathbb{R}^{k \times k}$, $V_f \in \mathbb{R}^{d \times k}$ and k is the cut-off parameter satisfying $\lambda_k \gg \lambda_{k+1}$. The singular values ($\lambda_{k+1}, \lambda_{k+2}, \ldots, \lambda_d$) constitute the so-called 'noise floor'. The Hankel matrix of real-world signal $\overline{X}$ also can be denoted by SVD as:

$$\overline{H} = [U_{1s} \; U_{2s}] \begin{bmatrix} \Sigma_{1s} & 0 \\ 0 & 0 \end{bmatrix} \begin{bmatrix} V_{1s}^T \\ V_{2s}^T \end{bmatrix}. \quad (6)$$

In order to recover $\overline{X}$ from $x_{in}$, the truncated SSA algorithm sets the singular values on the noise floor to zero, i.e., $(\lambda_{k+1}=\lambda_{k+2}=\ldots=\lambda_d=0)$. This is equivalent to obtain the signal estimator $\hat{H}$ from:

$$\hat{H} = [U_1 \; U_2] \begin{bmatrix} \Sigma_1 & 0 \\ 0 & 0 \end{bmatrix} \begin{bmatrix} V_1^T \\ V_2^T \end{bmatrix}. \quad (7)$$

Finally, through average calculating operation of the diagonal averaging of each element $\hat{x}_{i,j}$ along the anti-diagonal on the rank reduced matrix $\hat{H}$, the de-noised signal $X_{out}=\{\overline{x}_1, \overline{x}_2, \ldots, \overline{x}_N\}$ is obtained according to:

$$\overline{x}_t = \begin{cases} \frac{1}{t}\sum_{q=1}^{t} \hat{x}_{q,t-q+1} & \text{for } 1 \leq t < d \\ \frac{1}{d}\sum_{q=1}^{d} \hat{x}_{q,t-q+1} & \text{for } d \leq t \leq m \\ \frac{1}{N-t+1}\sum_{q=t-m+1}^{n-m+1} \hat{x}_{q,t-q+1} & \text{for } m < t \leq N \end{cases} \quad (8)$$

One can find, from Equations (6) to (8), that the truncated SSA algorithm removes the noise space, but reserves the projection of the noisy signal onto the signal-subspace. Such an algorithm contains the highest possible residual noise level.

II. Fuzzy Entropy-Assisted Soft Threshold De-Noising Method

A. Fuzzy Entropy

FuzzyEn is a robust measure to quantify signal complexity, and is applicable to any non-linear or non-stationary signals. The eth vector sequence of H in Equation (2) is rewritten as:

$$X_e^d = \{x_e^d, x_{e+1}^d, \ldots, x_{e+d-1}^d\} \; 1 \leq e \leq N-d+1 \quad (9)$$

The distance $D_{ef}^d$ between a pair of vectors $X_e^d$ and $X_f^d$ is defined as:

$$D_{ef}^d = D[X_e^d, X_f^d] = \max_{g \in [1,d]} |x_{e+g-1}^d - x_{f+g-1}^d|. \quad (10)$$

The degree of similarity between the pair of vectors $X_e^d$ and $X_f^d$ is determined by a Gaussian fuzzy membership function:

$$SD_{ef}^d = \exp(-(D_{ef}^d)^2/r). \quad (11)$$

where r is the boundary width of the fuzzy function. Given r, the average degree of similarity between vector $X_e^d$ and all its neighbors is given by:

$$S_r^d(e) = \frac{1}{N-d} \cdot \sum_{f=1, f \neq e}^{N-d+1} SD_{ef}^d, \quad (12)$$

Based on the concept of fuzzy probability in fuzzy mathematics, the probability that all pairs of vectors in the matrix H are similar is defined as:

$$S_r^d = \frac{1}{N-d+1} \cdot \sum_{e=1}^{N-d+1} S_r^d(e). \quad (13)$$

Similarly, we can construct a sequence of (d+1)-dimensional vectors $X_e^{d+1}=\{x_e^{d+1}, x_{e+1}^{d+1}, L, x_{e+d}^{d+1}\}_0$ ($1 \leq e \leq N-d$) from the original signal $X_{in}$ and define the degree of similarity $S_r^{d+1}(e)$ as well as the probability $S_r^{d+1}$. The FuzzyEn is then defined as:

$$\text{FuzzyEn}(d,r,N) = -\ln(S_r^{d+1}/S_r^d) \tag{14}$$

where d and r are set to 2 and 0.2, respectively.

Any noise-free or de-noised band-limit signal will have a smaller FuzzyEn value, while a noisy signal will have a larger FuzzyEn value, and with increasing noise level, the entropy value becomes higher. Monte Carlo simulation using 5000 samples indicates that FuzzyEn upper and lower limits of 95% confidence band for both Gaussian and uniformly distributed white noise are 1.66 and 1.74, respectively. Compared with several other linear and nonlinear statistics for quantization of signal complexity, FuzzyEn shows better monotonicity and relative consistency. For any set of components obtained from SSA, WT, EMD or any other signal decomposition approach, its FuzzyEn distribution can thus be defined as a fuzzy entropy spectrum model.

B. FuzzyEn Spectrum of SSA

With SSA decomposition for the noisy signals, the first component is a low frequency component, showing the main trend of the original signal, while the remaining components have distinct oscillatory or high frequency characteristics.

FIGS. 1A and 1B show the FuzzyEn spectrum (solid lines) and singular spectrum (dotted lines) of piecewise-regular signal with SNR 0 dB and 15 dB. FuzzyEn of noise-free (dashed lines) and noisy (dot-and-dash lines) signal, as well as the 95% confidence band of FuzzyEn for Gaussian white noise (rectangular) are also plotted on the drawing for comparison. FIGS. 2A and 2B present the same information for Riemann signal. The FuzzyEn arrangements in both drawings correspond to the order from the leading to subordinate singular values.

Several conclusions can be made from analyzing FIGS. 1A through 2B. First, there is no so-called 'noise floor' on the singular spectrum for some occasions; for example, in the cases of piecewise-regular signal with both SNRs and the Riemann signal with 15 dB SNR, no planar noise floor exists. However, the proposed FuzzyEn spectrum clearly outlines the relative noise level of each component, providing another noise floor to efficiently represent the noise level of each component relative to white noise as well as clean and noisy signals. Second, in each case, FuzzyEn of the first SSA component each closely approximates that of the clean signal. Finally, a major finding is that not all the high frequency components corresponding to the singular spectrum are strictly located in the 95% confidence band of white noise, which means some signal ingredients hidden in the high frequency components and indicates that the truncated SSA always removes all these components, resulting in information loss and influences on the de-noising performance.

C. Iterative SSA Soft Threshold De-Noising Method

Figure 3:
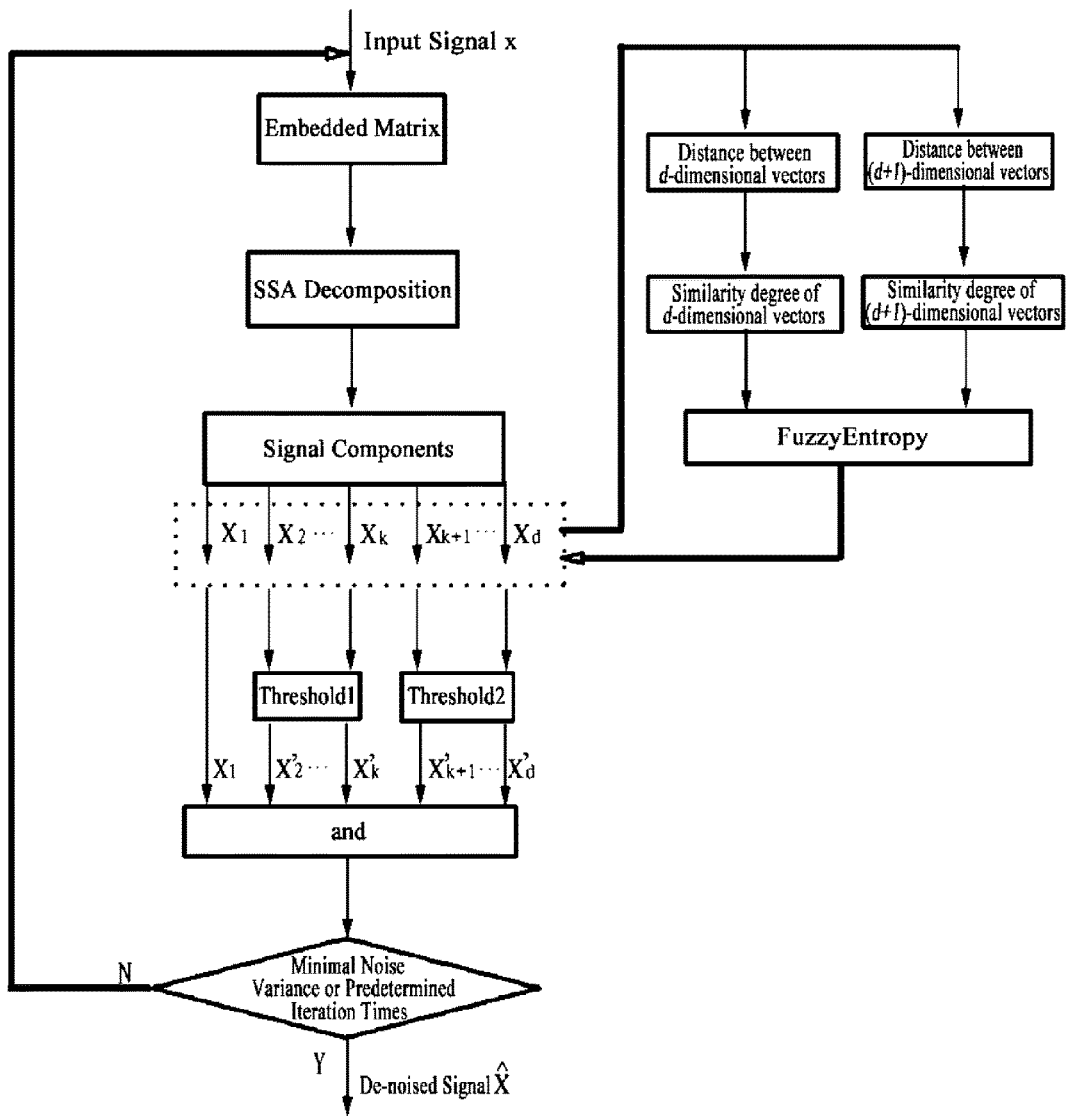
FIG. 3 is a schematic diagram of the present invention.

FIG. 3 is a schematic diagram of the iterative SSA soft threshold de-noising algorithm. Based on aforementioned findings of the FuzzyEn spectrum of noisy signal, a SSA component with a FuzzyEn value larger than that of the original noisy signal, particularly those approaching or within the 95% confidence band of white noise, it requires a larger threshold for smoothing. On the contrary, a component with FuzzyEn less than that of the noisy signal means that it has more signal ingredient and thus requires a smaller threshold. Particularly, the first SSA component, which contains the main trend of the signal and has a FuzzyEn value closely approaching that of the clean signal, should be totally retained in the signal recovery. Based on these principles, the iterative SSA soft threshold de-noising algorithm is summarized as:

(1) SSA decompose: the noisy signal $X_{in} = \{x_1, x_2, \ldots, x_N\}$ is embedded into a m×d Hankel matrix, and SVD is employed to decompose the Hankel matrix into the sum of d rank-1 matrices and then reconstruct d components $X_c = \{x_1^c, x_2^c, \ldots, x_N^c\}$ (c=1, ... d);

(2) Calculate FuzzyEn spectrum: the FuzzyEn spectrum of SSA components and the FuzzyEn value of original noisy signal are calculated, according to the FuzzyEn spectrum formula (14);

(3) Set soft threshold: no threshold de-noising is made to the first component $X_1$, for components from $X_2$ to $X_k$ whose FuzzyEn value is lower than that of the noisy signal, a smaller threshold is set as:

$$\tau_c = \sigma_c \sqrt{2\log_{10} N}/\sqrt{d}, (c=2, \ldots k, k<d) \tag{15}$$

where $\sigma_c$ is the variance of component $X_c$ and N is the signal length, and for the remaining components whose FuzzyEn value is no less than that the noisy signal, a larger threshold is set as:

$$\tau_c = \sigma_c \sqrt{2\log_{10} N} (c=k+1, \ldots, d) \tag{16}$$

(4) De-noise: all components $X_c$(c=2, ... ,d) except the first component are de-noised using relative threshold formula (15) or (16):

$$x_j^c = \begin{cases} x_j^c - \tau_c & \text{if } x_j^c \geq \tau_c \\ 0 & \text{if } |x_j^c| < \tau_c \\ x_j^c + \tau_c & \text{if } x_j^c \leq -\tau_c \end{cases} \tag{17}$$

where j=1, 2, ... ,N and the smoothed component is denoted as $\tilde{X}_c$(c=2, ... ,d);

(5) Recover Signal: a first de-noised signal is the sum of the first component and all other soft threshold de-noised components:

$$\tilde{X} = X_1 + \sum_{c=2}^{d} \tilde{X}_c \tag{18}$$

(6) Iterate: an iterative mechanism is used to further improve the SNR for the signal, since a signal de-noised by the fuzzy entropy spectrum once may still have residual noise. Estimate the variance of the noise $\tilde{n} = x - \tilde{x}$, reconstruct the embedded matrix using the estimated signal $\tilde{X}$, and repeat steps (1) to (5);

(7) Terminate the iteration: compare the variance of the noise obtained in successive iterations, if the noise variance is no longer decreased significantly or reaches the predetermined iteration times, the iteration stops; otherwise, repeat steps (1) to (6), and the de-noised signal $\tilde{X}$ is the sum of the trend with the minimal noise variance or the predetermined iteration times and all de-noised components.

III. Performance Evaluation

Apart from the piecewise-regular and Riemann signals, two more representative synthetic signals, i.e., blocks and sineoneoverx signals, are used here for demonstrating the performance of the proposed de-noising algorithm. Moreover, the proposed algorithm is also evaluated by two real-world signals, i.e., speech and electromyographic (EMG) signals, and is compared with the existing truncated SSA, WT, and EMD de-noising algorithms. Each of the four synthetic samples is tested with one of four different sampling frequencies to generate four samples with length 1024, 2048, 4096, and 8192, respectively, the performance parameter corresponding to an average of the SNRs for 50 de-noised noise samples.

A. Effect of Iteration Number

Figure 4A:
FIG. 4A illustrates a sample of the noisy piecewise-regular signal.
Figure 4B:
FIG. 4B illustrates a de-noised signal resulting from the SSA-IST algorithm using one iteration.
Figure 4C:
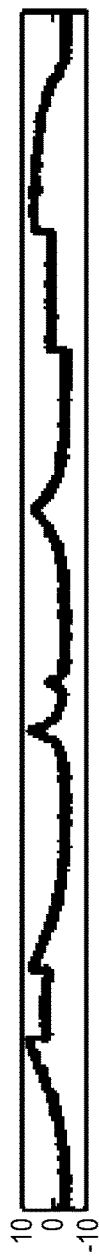
FIG. 4C illustrates a de-noised signal resulting from the SSA-IST algorithm using four iterations.
Figure 4D:
FIG. 4D illustrates a de-noised signal resulting from the SSA-IST algorithm using 14 iterations.
Figure 4E:
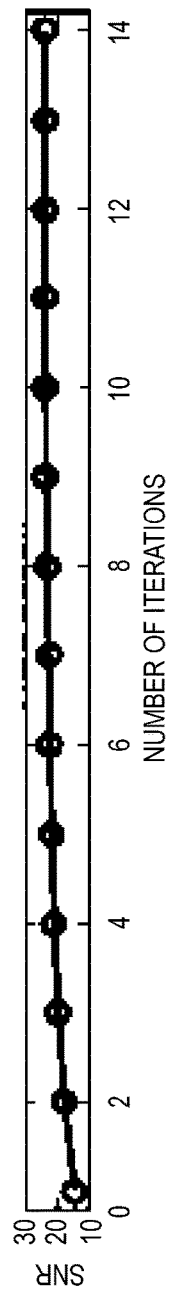
FIG. 4E is SNR improvement curve.
Figure 5A:
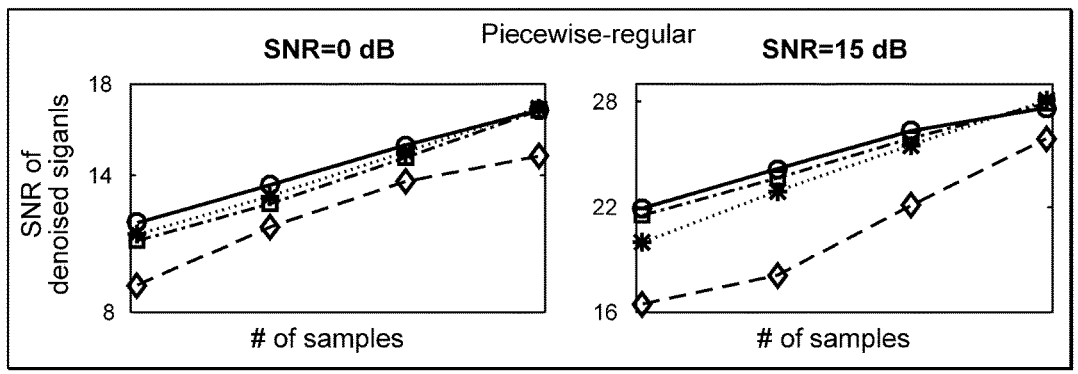
FIG. 5A illustrates signal-to-noise ratios of the piecewise-regular signal smoothed by SSA-IST (solid lines), truncated SSA (dashed lines), WT (dot-and-dash lines), and EMD (dotted lines) algorithms.
Figure 5B:
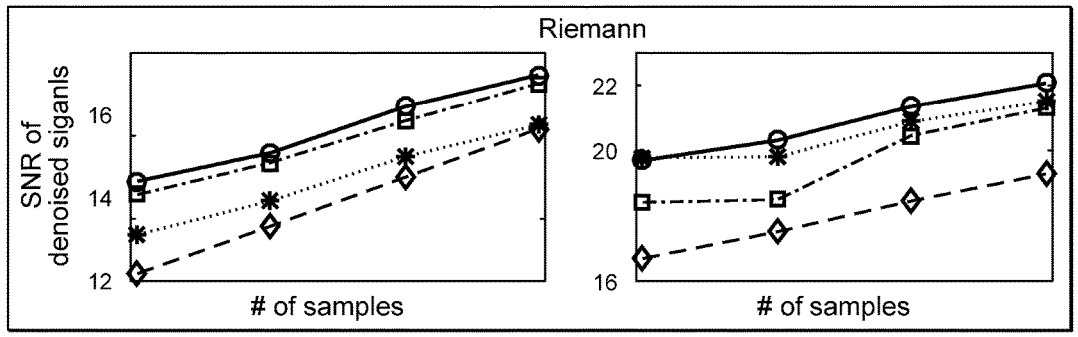
FIG. 5B illustrates signal-to-noise ratios of the Riemann signal smoothed by SSA-IST (solid lines), truncated SSA (dashed lines), WT (dot-and-dash lines), and EMD (dotted lines) algorithms.
Figure 5C:
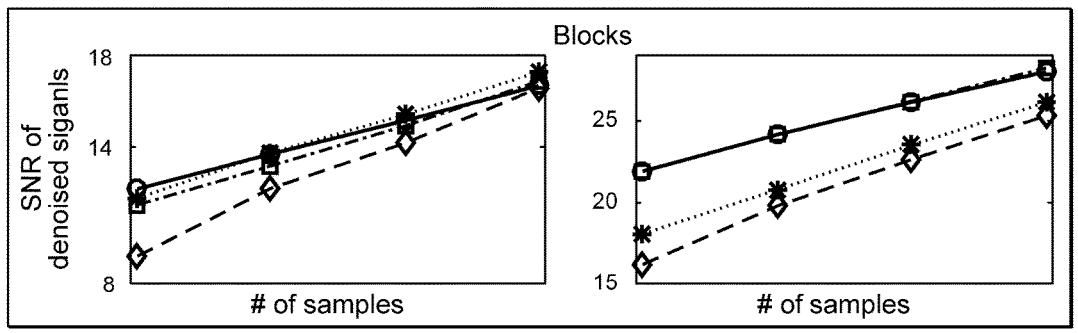
FIG. 5C illustrates signal-to-noise ratios of the blocks signal smoothed by SSA-IST (solid lines), truncated SSA (dashed lines), WT (dot-and-dash lines), and EMD (dotted lines) algorithms.
Figure 5D:
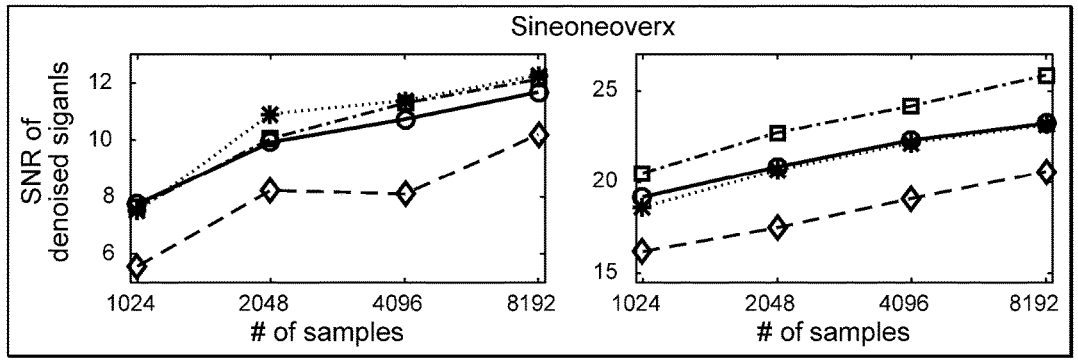
FIG. 5D illustrates signal-to-noise ratios of the sineoneoverx signal smoothed by SSA-IST (solid lines), truncated SSA (dashed lines), WT (dot-and-dash lines), and EMD (dotted lines) algorithms.

FIGS. 4A through 4E illustrate effects of iterative mechanism in the SSA-IST algorithm, taking the piecewise-regular signal as an example. FIG. 4A shows a sample of a piecewise-regular signal with SNR 15 and length 8192. FIG. 4B shows the waveform for the de-noised signal resulting from a first iteration of SSA-IST. FIGS. 4C and 4D are the output signals resulting from 4 and 14 iterations of SSA-IST, respectively. As can be seen from those time domain waveforms, the noise is significantly suppressed as the number of iterations is increased. FIG. 4E quantitatively shows the increment in SNR with respect to the number of iterations. In this case, the SNR of the noisy signal is enhanced from 15 dB to about 25 dB after 14th iterations, which has well demonstrated the de-noising capabilities of SSA-ST.

experimental signals de-noised by the SSA-IST and three other approaches are concluded in Table I. The variance of the SNR for multiple de-noised samples is another de-noising performance evaluation method, and is particularly efficient for real-world experimental signals. The variances corresponding to the SNRs de-noised by the four approaches are also listed in Table I. Similar to the synthetic signals, SSA-IST outperforms truncated SSA in all situations with significant SNR enhancement. Moreover, SSA-IST leads to gains between 1-2 dB SNR compared to the WT method, except for speech signal at 15 dB. The EMD seems a more competitive method to SSA-IST in terms of SNR enhancement, as it outperforms the latter for speech signal at all SNRs. However, SSA-IST outperforms EMD for the EMG signal at all SNRs, and the variance of SNRs for SSA-IST is lower than that of EMD for both signals.

Among all six signals tested here, the overall worst de-noising performance is observed for the EMG signal, followed by the Riemann signal, regardless of the approach. This may be due to the complicated signal constituent. For instance, the EMG signal contains a great number of spikes, and the Riemann signal has obvious high-frequency component with a shape like 1/f noise.

TABLE 1

SNRs AND VARIANCE OF THE SNRs OF DE-NOISED
SPEECH AND EMG SIGNALS BY FOUR ALGORITHMS

| Methods | SNR/Variance | | | | | |
|---|---|---|---|---|---|---|
| | −2 dB | 0 dB | 2 dB | 5 dB | 10 dB | 15 dB |
| Speech | | | | | | |
| SSA-IST | 10.3021/0.5184 | 11.1915/0.2636 | 12.7855/0.2509 | 15.5975/0.1918 | 18.3700/0.2187 | 21.4715/0.1907 |
| SSA | 8.6174/0.8510 | 9.3190/0.3828 | 10.3428/0.3221 | 12.0008/0.2766 | 14.2634/0.2583 | 17.9997/0.2315 |
| EMD | 10.4828/0.5961 | 12.1047/0.4234 | 13.9005/0.4225 | 15.7604/0.5558 | 19.2469/0.3741 | 22.2021/0.2962 |
| WT | 8.7383/0.8917 | 10.3194/0.2849 | 11.9866/0.2702 | 14.1729/0.4507 | 18.0784/0.1424 | 22.0473/0.0965 |
| EMG | | | | | | |
| SS-IST | 5.0321/0.1194 | 7.0393/0.0995 | 9.4689/0.0564 | 11.3130/0.0585 | 16.2228/0.0489 | 20.3765/0.0528 |
| SSA | 2.1467/0.1350 | 4.1807/0.1697 | 6.2173/0.1263 | 9.1326/0.1222 | 14.4067/0.0979 | 18.0073/0.0789 |
| EMD | 4.9291/0.0838 | 6.1096/0.0875 | 8.5762/0.1136 | 10.8119/0.0744 | 15.4137/0.1339 | 18.3436/0.0411 |
| WT | 4.5794/0.1581 | 5.8392/0.0540 | 7.2580/0.0483 | 9.7185/0.0218 | 14.9014/0.0479 | 18.8184/0.0547 |

B. Performance on Smoothed Synthetic Signal

FIGS. 5A through 5D show the de-noising effects of the proposed SSA-IST method, as well as the truncated SSA, WT, and EMD approaches on four synthetic signals. On each panel, the performance curve corresponds to the SNR of a de-noised signal with different sample length. They are grouped into sets associated with 15 dB SNR (right) and 0 dB SNR (left) before de-noising. We observe that SSA-IST (solid lines) significantly outperforms truncated SSA (dashed lines) for all situations with 2 to 5 dB enhancement after de-noising. Furthermore, in most cases, the SNR improvement of the SSA-IST is slightly better than or close to that of the EMD (dotted lines), with the exception in case of sineoneoverx signal with sample length 8192. With regard to the superiority of SSA-IST over WT (dot-and-dash lines), the de-noising performance of the former is better than the latter in the case of low SNRs. When SNR is 15 dB, WT tends to perform at least equal to or better than SSA-IST, especially in the case of the sineoneoverx signal.

C. Performance on Smoothed Experimental Signal

The de-noising performance of SSA-IST is now evaluated using two real-world experimental signals, i.e., speech and EMG signals. The sampling rate of speech is 16 kHz, and the EMG sampling rate is 1 kHz. The SNRs of the two de-noised IV. Conclusion The traditional truncated SSA smoothing method relates to a binary approach of retaining some components and discarding the other components. In the frequency domain this is equivalent to low-pass filtering and thus results in information loss at high band. In addition, such a method depends on subjectively finding a noise floor which may not exist in many instances. The present invention first proposes to replace the singular spectrum with a FuzzyEn spectrum and, regardless of signal properties and noise levels, the FuzzyEn spectrum can accurately provide relative noise level of each component of the noisy signal, which will be an important basis for various signal de-noising or improvement of other signal de-noising approaches. Based on the FuzzyEn spectrum, we provide an iterative singular spectrum analysis soft threshold de-noising algorithms, which is verified to be more effective for enhancing the SNRs of the noisy signals as compared to the truncated SSA approach by de-noising four synthetic and two experimental signals at different SNRs. The present invention may be broadly applied to de-noising in mobile devices, hearing aids, wearable devices, medical instruments or biomedical, mechanical and radar signals.

The aforementioned embodiments are intended to be further description of the objectives, technical solutions, and beneficial effects of the present invention in details, and it should be understood that the aforementioned disclosure is only specific embodiments of the present invention, but is not limited thereto. The present invention will extend to any new features or new combination disclosed in the invention and the disclosed steps of any new method or processes, or any new combination.

What is claimed is:

1. A fuzzy entropy based noisy signal processing method, comprising the following steps each performed automatically by a computing device:

considering a noisy signal $X_{in}=\{x_1, x_2, \ldots, x_N\}$ of N samples, the noisy signal generated from at least one of a mobile device, a hearing aid, a wearable device, a medical instrument, and biomedical, mechanical, and radar signal devices, and it is assumed that the additive white noise is uncorrelated with the signal, i.e., $X_{in}=\overline{X}+n$, where $\overline{X}$ represents the noise-free signal, and n the white noise, constructing a series of d-dimensional vectors $X_e^d=\{x_e^d, x_{e+1}^d, \ldots, x_{e+d-1}^d\}$, $(1 \leq e \leq N-d+1)$, from the original signals $X_{in}$ generated from the at least one of the mobile device, the hearing aid, the wearable device, the medical instrument, and the biomedical, mechanical, and radar signal devices, defining the degree of similarity $S_r^d(e)$ and the fuzzy probability $S_r^d$, and constructing a $(d+1)$-dimensional vector $X_e^{d+1}$ as well as its corresponding degree of similarity $S_r^{d+1}(e)$ and fuzzy probability $S_r^{d+1}$, wherein the FuzzyEn is defined by: $\text{FuzzyEn}(d,r,N)=-\ln(S_r^{d+1}/S_r^d)$, where d and r are set to 2 and 0.2 respectively, N is the length of the signal to be de-noised, thereby defining the singular spectrum distribution of all components obtained from any signal decomposition approach as a FuzzyEn spectrum, and wherein a de-noised signal is obtained from the noisy signal for the at least one of the mobile device, the hearing aid, the wearable device, the medical instrument, and the biomedical, mechanical, and radar signal devices.

2. An iterative singular spectrum analysis soft threshold de-noising method based on a FuzzyEn spectrum, applied to a noisy signal generated from at least one of a mobile device, a hearing aid, a wearable device, a medical instrument, and biomedical, mechanical, and radar signal devices, comprising the following steps each performed automatically by a computing device:

(1) SSA decomposition: the noisy signal $X_{in}=\{x_1, x_2, \ldots, x_N\}$ generated from the at least one of the mobile device, the hearing aid, the wearable device, the medical instrument, and the biomedical, mechanical, and radar signal devices is embedded into a m×d Hankel matrix, and SVD is employed to decompose the Hankel matrix into the sum of d rank-1 matrices and then reconstruct d signal components $X_c\{x_1^c, x_2^c, \ldots, x_N^c\}(c=1, \ldots d)$;

(2) fuzzyEn spectrum calculation: the FuzzyEn spectrum of SSA components and the FuzzyEn value of the original noisy signal generated from the at least one of the mobile device, the hearing aid, the wearable device, the medical instrument, and the biomedical, mechanical, and radar signal devices are calculated, wherein the FuzzyEn is defined by: $\text{FuzzyEn}(d,r,N)=-\ln(S_r^{d+1}/S_r^d)$, where d and r are set to 2 and 0.2 respectively, N is the length of the signal to be de-noised, thereby defining the singular spectrum distribution of all components obtained from any signal decomposition approach as a FuzzyEn spectrum;

(3) soft threshold setting: no threshold de-noising is made to the first component $X_1$, for components from $X_2$ to $X_k$ whose FuzzyEn value is lower than that of the noisy signal, a smaller threshold is set as $\tau_c=\sigma_c\sqrt{2\log_{10}N}/\sqrt{d}$, and for the remaining components from $X_{k+1}$ to $X_d$, a larger threshold is set as $\tau_c=\sigma_c\sqrt{2\log_{10}N}$, where $\sigma_c$ is the variance of component $X_c$;

(4) soft threshold de-noise: all components $X_c$ $(c=2, \ldots, d)$ except the first component are de-noised using soft threshold, namely, if the absolute value of the numerical value of a certain noisy signal of each component is lower than the threshold for this component, the output is zero; if the signal value is larger than the threshold, the output is the signal value minus the threshold; otherwise, the output is the signal value plus the threshold, where the sum of all soft threshold de-noised components $\overline{X}_c$ $(c=2, \ldots, d)$ and $x_1$ is a first estimated signal $\tilde{x}$ and the estimated noise is set as $\tilde{n}=x_{in}-\tilde{x}$;

(5) estimate the variance of $\tilde{n}$, using the estimated noise $\tilde{x}$ as an input signal, repeat steps (1) to (4);

(6) compare the variance of the noise obtained in successive iterations, if the noise variance is no longer decreased significantly or reaches the predetermined iteration times, the iteration stops; otherwise, repeat steps (1) to (5); and (7) the de-noised signal $\tilde{x}$ is the sum of the trend $x_1$ with the minimal noise variance or the predetermined iteration times and all de-noised components $\tilde{x}_c(c=2, \ldots, d)$, wherein a de-noised signal is obtained from the noisy signal for the at least one of the mobile device, the hearing aid, the wearable device, the medical instrument, and the biomedical, mechanical, and radar signal devices.

* * * * *